United States Patent
Edwards et al.

(10) Patent No.: US 8,963,651 B2
(45) Date of Patent: Feb. 24, 2015

(54) FREQUENCY TEMPERATURE OFFSET COMPENSATION

(71) Applicant: Analog Devices, Inc., Norwood, MA (US)

(72) Inventors: Robert Timothy Edwards, Clarksburg, MD (US); Stephen Mark Beccue, Thousand Oaks, CA (US)

(73) Assignee: Analog Devices, Inc., Norwood, MA (US)

( * ) Notice: Subject to any disclaimer, the term of this patent is extended or adjusted under 35 U.S.C. 154(b) by 47 days.

(21) Appl. No.: 13/783,086

(22) Filed: Mar. 1, 2013

(65) Prior Publication Data

US 2014/0247095 A1 Sep. 4, 2014

(51) Int. Cl.
*H03L 1/00* (2006.01)
*H03L 1/02* (2006.01)

(52) U.S. Cl.
CPC .................................. *H03L 1/02* (2013.01)
USPC ............................ 331/176; 331/154; 331/175

(58) Field of Classification Search
CPC ........................................................ H03B 5/30
USPC ................................ 331/116 R, 154, 158, 176
See application file for complete search history.

(56) References Cited

U.S. PATENT DOCUMENTS

| 5,041,799 A | 8/1991 | Pirez |
| 5,691,671 A | 11/1997 | Bushman |
| 5,848,355 A | 12/1998 | Rasor |
| 6,661,302 B1 | 12/2003 | Rathore et al. |
| 6,995,622 B2 * | 2/2006 | Partridge et al. ............... 331/66 |
| 7,755,441 B1 | 7/2010 | Cioffi et al. |
| 2011/0187422 A1 * | 8/2011 | Hammes et al. .............. 327/156 |

* cited by examiner

*Primary Examiner* — Joseph Chang
*Assistant Examiner* — Jeffrey Shin
(74) *Attorney, Agent, or Firm* — Knobbe, Martens, Olson & Bear, LLP

(57) ABSTRACT

One embodiment relates to a method of compensating for crystal frequency variation over temperature. An example method includes obtaining an indication of temperature, computing a temperature compensation value based on the indication of temperature and a piecewise linear temperature compensation approximation, and compensating for a temperature offset in a crystal reference signal by adjusting a division ratio of a fractional divider in a phase-locked loop. The piecewise linear temperature compensation approximation can represent an approximation of frequency error in a crystal reference signal originating from a crystal over temperature. The piecewise linear temperature compensation approximation can be, for example, a linear approximation, a quadratic approximation, or a cubic approximation.

22 Claims, 7 Drawing Sheets

FREQUENCY TEMPERATURE OFFSET COMPENSATION

TECHNICAL FIELD

The disclosed technology relates to electronic systems, and, more particularly, to circuits configured to compensate for temperature-dependent frequency error.

DESCRIPTION OF THE RELATED TECHNOLOGY

Electronic systems can include timing circuits configured to generate clock signals. Such timing circuits can include a phase-locked loop that locks a phase of a reference signal to an output signal. The reference signal can be generated by a crystal, such as a quartz crystal or a polycrystalline ceramic crystal. The crystal can generate an electrical signal having a very precise frequency.

Variation over temperature is one source of error in timing circuits in which a frequency of an output signal is generated by locking its phase with a crystal reference signal generated by a crystal. For instance, variation in a frequency of the crystal reference signal over a standard commercial temperature range of about −40° C. to +80° C. can be about 50 parts per million (ppm). However, some telecommunications standards require that a frequency error be no greater than about 2 ppm or 3 ppm. Outside the commercial temperature range, crystal frequency errors can be even more severe than in the commercial temperature range.

A number of existing methods of compensating for crystal frequency variation over temperature use a relatively large amount of memory to store data for accurate temperature compensation. Moreover, the extent of such temperature compensation can be limited by the size of the memory storing temperature compensation data. Furthermore, such methods can only compensate for temperatures for which temperature compensation values are stored in the memory. Accordingly, a need exists for improved compensation of errors resulting from crystal frequency due to temperature variation.

SUMMARY OF CERTAIN INVENTIVE ASPECTS

One aspect of this disclosure is an electronically-implemented method of compensating for a temperature offset in a crystal reference signal. The method includes obtaining an indication of a temperature. The method also includes computing a temperature compensation value based on the indication of temperature and a piecewise linear temperature compensation approximation. The piecewise linear temperature compensation approximation represents an approximation of frequency error of a crystal reference signal originating from a crystal over temperature as a plurality of linear segments. The method further includes compensating for a temperature offset in the crystal reference signal by adjusting a division ratio of a fractional divider in a phase-locked loop based on the temperature compensation value. The phase-locked loop is configured to lock a phase of a frequency divided version of an output signal of the phase-locked loop to the crystal reference signal.

Another aspect of this disclosure is an apparatus that includes a phase-locked loop and a temperature compensation circuit. The phase-locked loop is configured to receive a reference signal and to lock a phase of an output clock signal with a phase of the reference signal. The phase-locked loop includes a fractional divider. The temperature compensation circuit is configured to compute a temperature compensation value based on an indication of temperature and a piecewise linear temperature compensation approximation. The piecewise linear temperature compensation approximation represents an approximation of frequency error in the reference signal over temperature. The temperature compensation circuit is configured to compensate for a temperature offset in the frequency of the reference signal by adjusting the division ratio of the fractional divider based at least partly on the temperature compensation value.

Another aspect of this disclosure is an apparatus that includes a die. The die includes a phase-locked loop and a temperature compensation circuit. The phase-locked loop is configured to receive a reference signal and to lock a phase of an output signal with a phase of the reference signal. The phase-locked loop includes a fractional divider configured to divide the frequency of the output signal by a division ratio. The temperature compensation circuit is configured to compute a temperature compensation value based on a piecewise linear temperature compensation approximation and an indication of temperature. The temperature compensation circuit is configured to compensate for a temperature-dependent offset in the frequency of the reference signal by adjusting the division ratio of the fractional divider based at least partly on the temperature compensation value.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1:
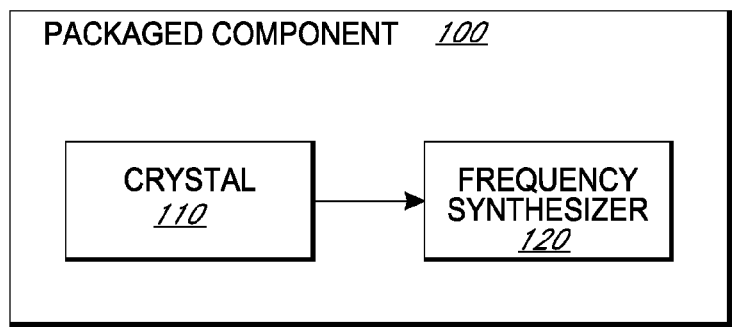
FIG. 1 is a block diagram of a packaged component.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements.

As discussed above, crystal frequency variation over temperature is one source of error in timing circuits. The methods, systems, and apparatus described herein can compensate for the offset in frequency of a crystal clock signal caused by temperature changes to create a substantially stable output frequency over temperature. Such compensation can be implemented on a frequency synthesizer die that includes a fractional-N frequency synthesizer. A fractional-N frequency synthesizer can generate an output with an arbitrary frequency ratio to an input signal, which can be provided by a crystal oscillator. Typically, an end user selects a suitable crystal frequency and a fractional divider value to generate a desired output frequency. Since the fractional-N synthesizer can maintain an input-to-output frequency of arbitrary precision, which can be limited by the number of bits used to encode the fractional divider value, an offset value can be used to adjust the user selected fractional divider value. Such an offset can modulate the output frequency of the fractional-N synthesizer to at least partially compensate for an offset in the crystal frequency.

Some previous techniques using offset correction were performed off a frequency synthesizer chip in a computationally expensive manner. Moreover, such previous temperature offset compensation typically used a relatively large amount of memory to store a number of temperature compensation values used for temperature compensation. The number of temperature compensation values and the degree of precision of the temperature compensation at temperatures corresponding to the temperature compensation values can be limited by the size of the memory, as more bits are needed for more precise temperature compensation values and only a finite number of temperature compensation values can be stored. Moreover, such temperature compensation can typically compensate only for temperatures for which temperature compensation values are stored in the memory. Due to the limited amount of die area and the cost of increasing the die area, this previous offset compensation technique used too much circuitry and/or memory to be efficiently implemented on a frequency synthesizer die.

It can be desirable to implement temperature offset correction on chip. For example, an on-die temperature compensation circuit can reduce overall power consumption and/or area of an electronic system. Furthermore, an on-die offset compensation circuit can reduce the number of different die in a system compared with previous systems. This can reduce costs. Moreover, on-die temperature compensation can be a differentiating feature that boosts product sales. Advantageously, the piecewise linear temperature approximations described herein provide computationally efficient ways of computing a temperature compensation value. These methods can be implemented on the same die as a frequency synthesizer, in some embodiments. Moreover, the piecewise linear temperature approximations described herein can compute a temperature compensation value from a few stored data values using a relatively small amount of digital circuitry, according to certain embodiments.

With reference to FIG. 1, a packaged component 100 will be described. The packaged component 100 includes a plurality of components included within a single package. As illustrated in FIG. 1, the packaged component 100 includes a crystal oscillator 110 and a frequency synthesizer 120 in a single package. It can be advantageous to package more than one component in a single package so that components can be connected together within the package and protected from an environment outside the package. Moreover, packaged component 100 can be sold as a unit. In certain implementations, the packaged component 100 can include one or more other components (not illustrated) within a single package.

Figure 2:
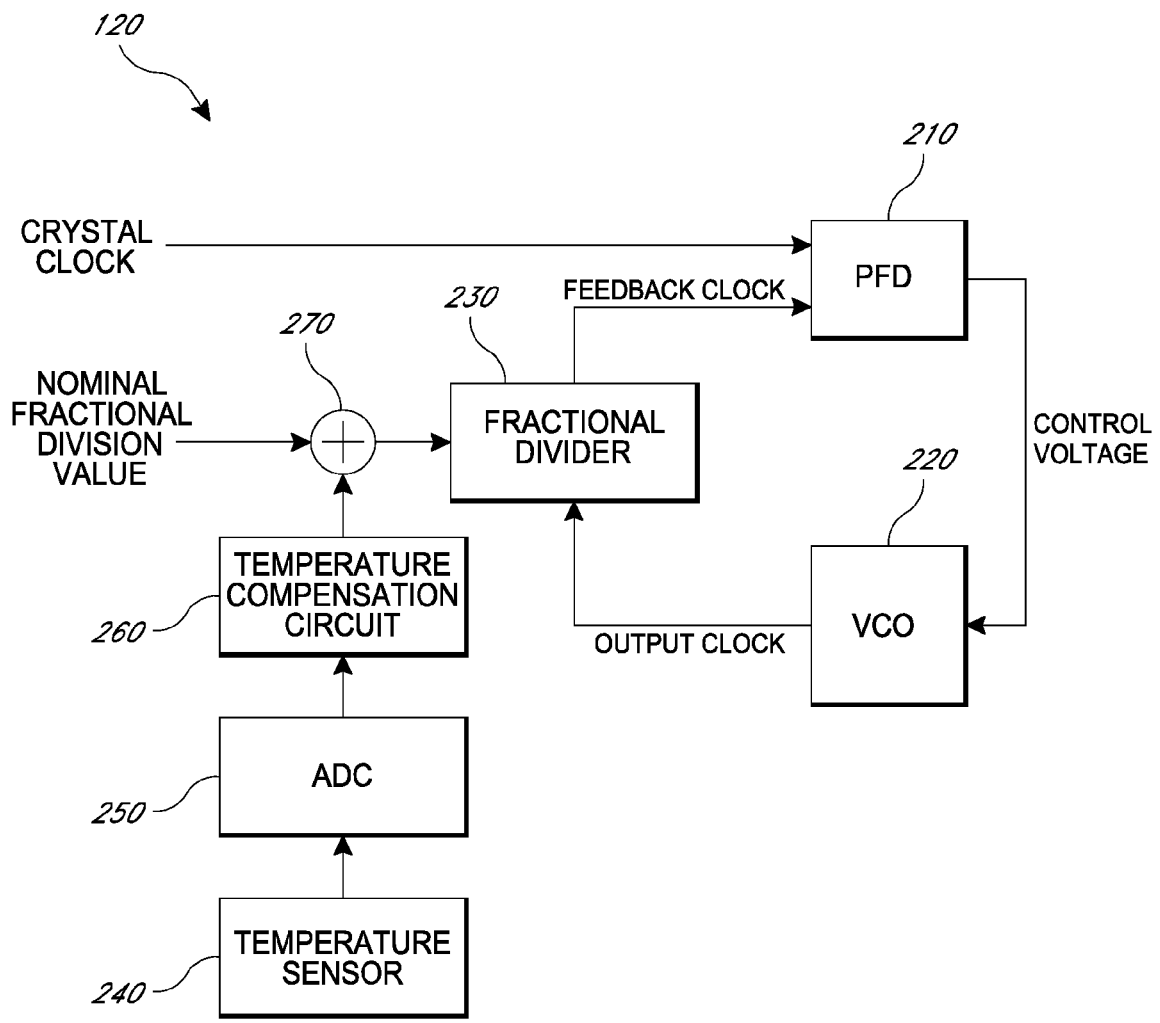
FIG. 2 is a schematic block diagram of a frequency synthesizer with temperature compensation, according to an embodiment.

FIG. 2 is a schematic block diagram of a frequency synthesizer 120 with a temperature compensation circuit 260, according to an embodiment. The frequency synthesizer 120 can be implemented on a single die. As illustrated, the frequency synthesizer 120 is a fractional-N frequency synthesizer. The frequency synthesizer 120 of FIG. 2 can be included in the packaged component 100 of FIG. 1 in certain embodiments. The illustrated frequency synthesizer 120 includes a phase-frequency detector (PFD) 210, a voltage-controlled oscillator (VCO) 220, a fractional divider 230, a temperature sensor 240, an analog-to-digital converter (ADC) 250, a temperature compensation circuit 260, a summing circuit 270. In some other implementations, the frequency synthesizer 120 can include more or fewer components. For instance, the temperature sensor 240 may be separate from a die that includes the frequency synthesizer 120, and such a temperature sensor is typically not considered part of the frequency synthesizer 120.

The frequency synthesizer 120 can include a phase-locked loop (PLL) comprising the PFD 210, the VCO 220, and the fractional divider 230. The PLL can be a closed-loop, frequency-control system that generates an output signal being phase locked to the phase of the input reference signal, such as a crystal clock signal. As illustrated in FIG. 2, the input reference signal can be a crystal clock signal received from a crystal oscillator. It will be understood that any suitable input reference signal can be used in place of the crystal clock signal in accordance with the principles and advantages described herein. The PFD 210 can receive the crystal clock signal and align an edge of the crystal clock signal (for example, a rising edge) to a feedback clock signal generated by the fractional divider 230. The fractional divider 230 can generate the feedback clock signal based on an output clock signal generated by the VCO 220 and a divider value N, where N is not necessarily an integer. The fractional divider 230 can use a mash modulator or equivalent circuit to convert a multi-bit value, with includes an integer portion and a fractional portion, into a fixed relationship between the frequency of the crystal clock signal and the frequency of the output clock signal of the PLL. The divider value will be discussed in more detail later. The feedback clock signal can have a frequency of the frequency of the output clock signal generated by the VCO 220 divided by N.

The PFD 210 can detect a relative difference in phase and frequency between the crystal clock signal and the feedback clock signal. The PFD 210 can generate a control voltage based on whether the feedback clock signal frequency is lagging or leading the crystal clock signal. The control voltage can cause the VCO 220 to adjust the frequency of the output clock signal to align the phase of the output clock signal with the crystal clock signal. When the feedback clock signal and the crystal clock signal are aligned, control voltage can cause the VCO 220 to maintain an approximately constant frequency of the output clock signal. Based on the voltage level of the control voltage, the VCO 220 can oscillate at a higher or a lower frequency, which can consequently affect the phase and frequency of the feedback clock signal. Once the crystal clock signal and the feedback clock signal have substantially the same phase and frequency, the oscillation of the VCO 220 can stabilize and an output clock signal with a desired frequency can be generated.

In a fractional-N frequency synthesizer, the fractional divider 230 can set the output clock signal frequency to an adjustable ratio of the crystal clock signal frequency. The ratio need not be an integer. A fractional-N synthesizer with fine resolution can maintain a precise relationship between output clock signal frequency and the crystal clock signal frequency. Since the fractional-N synthesizer can set the output clock signal frequency to a specific ratio of the crystal clock signal frequency, errors and/or variations in the crystal clock frequency can be proportionally translated to the output clock signal frequency. By obtaining an indication of temperature of a crystal that generates the crystal clock signal, the fractional-N synthesizer can compensate for crystal frequency error over temperature by adjusting the divider value of the fractional divider 230.

The frequency synthesizer 120 can obtain an indication of temperature of a crystal from which the crystal clock signal originates. For instance, in one embodiment, the frequency synthesizer 120 can be included in the same package as the crystal and a temperature sensor 240 of the frequency synthesizer die can approximate the temperature of the crystal. As another example, a temperature sensor external to the frequency synthesizer die can obtain an indication of the temperature of the crystal and provide the indication of temperature to an input of the frequency synthesizer die. The indication of temperature of the crystal can be provided to the ADC 250 in certain implementations. The indication of temperature can be an analog signal, and the ADC 250 can convert the indication of temperature into a digital word.

Together, the temperature sensor 240 and the ADC 250 can generate a temperature value that can be provided to the temperature compensation circuit 260. The temperature compensation circuit 260 can be implemented on the same die as the PLL. The temperature compensation circuit 260 can be implemented by digital circuits. In one embodiment, the temperature compensation circuit 260 is completely or almost completely implemented by digital circuits. The temperature compensation circuit 260 can compute a temperature compensation value based on the temperature value and a piecewise linear temperature compensation approximation. The piecewise linear temperature compensation approximation can represent an approximation of frequency error in the crystal clock signal over temperature. More detail will be provided later about the piecewise linear temperature compensation approximation.

The temperature compensation circuit 260 can compensate for a temperature offset in the frequency of the input reference signal (for example, the crystal clock signal) by adjusting the division ratio of the fractional divider 230 based at least partly on the temperature compensation value. This can reduce a temperature-dependent frequency error in the frequency of the output clock signal. In certain implementations, the temperature compensation circuit 260 can adjust the division ratio of the fractional divider 230 indirectly, for example, by providing the temperature compensation value to a summing circuit 270 that adjusts a nominal fractional division value based on the temperature compensation value. Moreover, in some implementations (not illustrated), the temperature compensation circuit 260 can include circuitry configured to combine a nominal fractional division value and the temperature compensation value, and to provide the combined value to the fractional divider 230 to adjust the fractional division value of the fractional divider 230. By adjusting the division ratio of the fractional divider 230, the temperature compensation circuit 260 can enable the PLL to maintain a substantially constant frequency of the output clock signal as temperature varies.

The temperature compensation value can be added to a nominal fractional division value by the summing circuit 270. The temperature compensation value can be positive, negative, or zero. According to certain embodiments, a combining circuit can perform other arithmetic operations, such as subtraction or multiplication, to combine the nominal fractional division value with the temperature compensation value. Such a combining circuit can also implement addition with other arithmetic operations in some implementations. In one implementation, the nominal fractional division value can be provided by an end user to generate a desired frequency of the output clock signal. In some embodiments, the temperature compensation value computed by the temperature compensation circuit 260 can be scaled or otherwise adjusted before being provided to the summing circuit 270 or other circuitry configured to combine the nominal fractional division value and the temperature compensation value. An output of the summing circuit 270 can be provided to the fractional divider 230 to set the division ratio of the fractional divider 230. The division ratio is a ratio by which the fractional divider 230 divides the output clock signal frequency to generate the feedback clock signal. Accordingly, the frequency of the feedback clock signal times the division ratio should equal the frequency of the output clock signal.

Crystal frequency variation over temperature typically follows a known gradient as represented by Equation 1:

$$f_{ERR} = aT^3 + bT^2 + cT + d \qquad \text{(Equation 1)}$$

In Equation 1, $f_{ERR}$ can represent a temperature-dependent frequency error in the frequency of a crystal, T can represent a temperature of the crystal, and a, b, c, and d can represent predetermined coefficients for the crystal. The coefficients a, b, c, and d can be determined through measurement and curve fitting. The coefficients a, b, and c can be approximated by the piecewise linear approximations described herein. The coefficient d can be accounted for in the nominal fractional division value in certain implementations.

Figure 3:
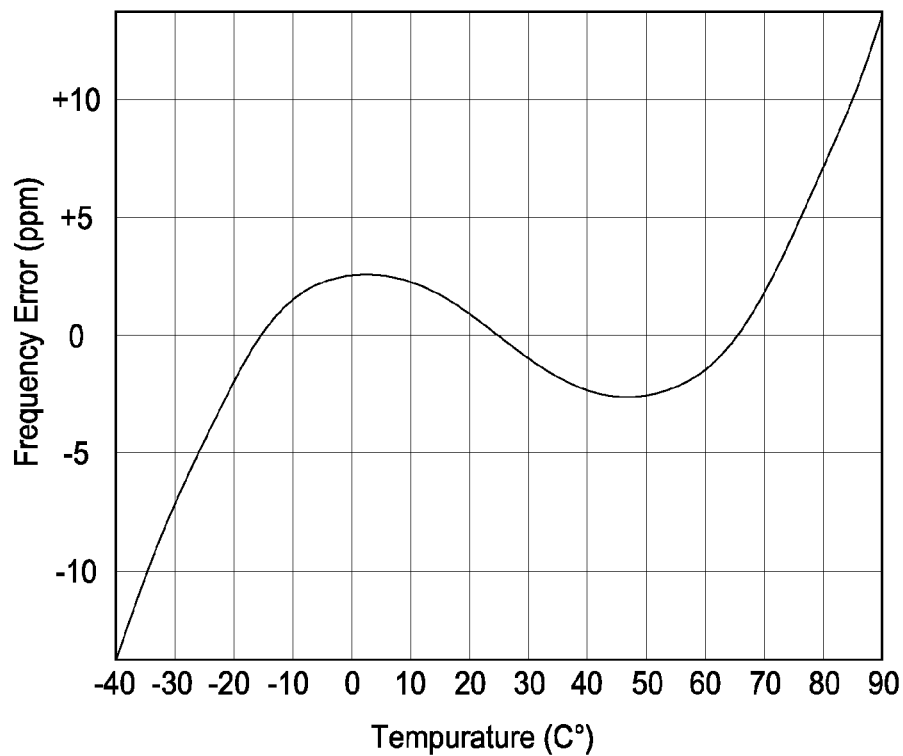
FIG. 3 is a graph of a crystal frequency error over temperature for an example crystal.

FIG. 3 illustrates an example frequency error curve over temperature for a crystal. The illustrated curve is a cubic curve, as described in Equation 1. A frequency error curve over temperature can be generated for an individual crystal or for one or more crystals from a batch of crystals manufactured together, in certain implementations. A crystal can be manufactured to center the shallowest part of the error profile around an ambient operating temperature, such as room temperature. However, the cubic nature of the curve can result in relatively large deviations as the operating temperatures deviate from the ambient operating temperature.

While a cubic fit to the frequency error curve over temperature can lead to an accurate temperature compensation solution, the cubic fit is computationally intensive to compute. A piecewise linear temperature compensation approximation can provide an efficient way to reduce temperature-dependent frequency errors. In some instances, using a piecewise linear temperature compensation approximation can be nearly as accurate as using a cubic fit.

Figure 4:
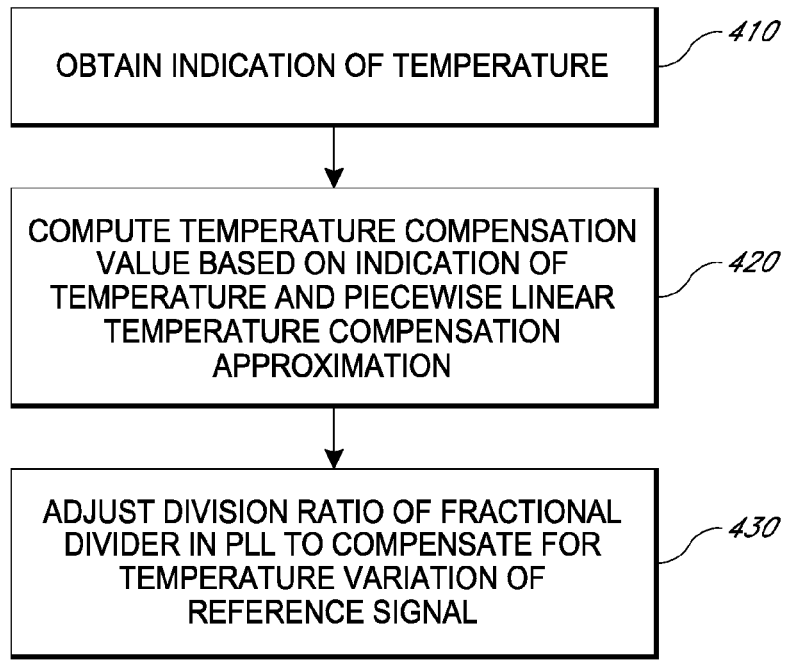
FIG. 4 is a flow diagram of an illustrative method of temperature compensation, according to an embodiment.

FIG. 4 is a flow diagram of an illustrative method 400 of temperature compensation, according to an embodiment. The method 400 can be implemented in connection with one or more features of the frequency synthesizer 120. Any combination of the features of the method 400 may be embodied in a tangible non-transitory computer storage. When instructions stored in the non-transitory computer storage are executed by, for example, a processor, the instructions may cause some or all of the method 400 to be performed. It will be understood that any of the methods discussed herein may include greater or fewer operations and the operations may be performed in any order, as appropriate.

At block 410, an indication of temperature can be obtained. The indication of temperature can be indicative of a temperature of a crystal of a crystal oscillator that provides a crystal reference signal to a PLL. The indication of temperature can be obtained via a temperature sensor, such as the temperature sensor 240. In one embodiment, the indication of temperature is obtained via a temperature sensor on a frequency synthesizer die that is separate from and included in the same package as the crystal of the crystal oscillator. In some embodiments, the indication of temperature can be an analog signal generated by a temperature sensor, which is converted into a digital word by an ADC.

A temperature compensation value can be computed based on the indication of temperature and a piecewise linear temperature compensation approximation at block 420. The temperature compensation value can be computed by the temperature compensation circuit 260. The computation of the temperature compensation value can be computationally relatively efficient. As such, computing the temperature compensation value can be implemented on a die that includes a PLL for which frequency error in an output is being reduced based on the temperature compensation value. In some embodiments, the temperature compensation value can be computed by performing arithmetic operations on three stored data values and data indicative of temperature, such as a digital word from an ADC.

The piecewise linear temperature compensation approximation can represent an approximation of frequency error in a crystal reference signal generated by a crystal over temperature. The piecewise linear temperature compensation approximation can be a collection of linear segments when frequency error is plotted as a function of temperature. The temperature compensation circuit can advantageously compute temperature compensation values from the indication of temperature without storing multiple data points each corresponding to a particular temperature. In certain embodiments, the piece-wise linear temperature compensation approximation can be implemented by three stored data values and an algorithm implemented by a temperature compensation circuit to compute a temperature compensation value based on the indication of temperature and the three stored data values. The three stored values can include a low temperature breakpoint TCOLO, a high temperature breakpoint TCOHI, and a slope multiplier SLOPE. The low temperature breakpoint TCOLO and the high temperature breakpoint TCOHI can divide the frequency error over temperature curve of the piece-wise linear temperature compensation approximation into three regions: a low temperature region for temperatures below the low temperature breakpoint TCOLO, a middle temperature region for temperatures between the low temperature breakpoint TCOLO and the high temperature breakpoint TCOHI, and a high temperature region for temperatures above the high temperature breakpoint TCOHI. The temperature compensation value can be computed differently for temperatures in each the three regions in certain implementations. The frequency error over temperature curve of the piece-wise linear temperature compensation approximation can have a positive slope in the low temperature region and the high temperature region and a negative slope in the middle temperature region, according to certain embodiments. In each of these three regions, the frequency error over temperature curve of the piece-wise linear temperature compensation approximation can be represented by one or more linear segments. It will be understood that any suitable number of segments can be used in each of the three regions. Four example algorithms will be discussed in more detail in connection with FIGS. 5-9.

Referring back to FIG. 4, the division ratio of a fractional divider in a PLL can be adjusted to reduce a temperature-dependent variation in a reference signal, such as a crystal reference signal, at block 430. For instance, division ratio can be adjusted by the temperature compensation value. In one embodiment, the summing circuit 270 can provide a sum of a nominal division ratio and the temperature compensation value computed by the temperature compensation circuit 260 to the fractional divider 230. As another example, other arithmetic operations, such as subtraction and/or multiplication, can be used to combine the nominal division ratio with the temperature compensation value. In one implementation, the temperature compensation value can increase the division ratio when the indication of temperate corresponds to a temperature with a higher frequency error than a previous temperature, which can cause the output frequency of the output clock signal of the PLL to decrease. In this implementation, the temperature compensation value can also decrease the division ratio when the indication of temperate corresponds to a temperature with a lower frequency error than a previous temperature, which can cause the output frequency of the output clock signal of the PLL to increase. The division ratio of the fractional divider can be adjusted dynamically in certain embodiments.

Four example algorithms for computing a temperature compensation value will now be described. These four example algorithms compute a temperature compensation value from three stored values and an indication of temperature T. In this way, a temperature compensation value can be computed for a particular indication of temperature without storing an entire temperature compensation curve. The three stored values can represent a low temperature breakpoint TCOLO, a high temperature breakpoint TCOHI, and a slope multiplier SLOPE. The break points TCOLO and TCOHI can be selected based on the frequency error over temperature curve for a particular crystal. For example, the break points TCOLO and TCOHI can correspond to the inflection points of the frequency error over temperature. As another example, the break points TCOLO and TCOHI can correspond to the inflection points of the frequency error over temperature scaled by a multiplier, which can make an algorithm easier to implement in hardware and/or more computationally efficient. The slope multiplier SLOPE can be obtained by measurement and fitting of a crystal or one or more crystals from a batch of crystals. For instance, an optimization algorithm can determine the slope multiplier SLOPE. The slope multiplier SLOPE can be different for each of the example algorithms. For instance, the slope multiplier SLOPE can be scaled to reduce the computational complexity of implementing a temperature compensation algorithm. Moreover, the temperature compensation values computed by these algorithms can be scaled or otherwise adjusted before being combined with a nominal fractional division value.

Each of these algorithms can be implemented by digital circuit elements. For instance, these algorithms can be represented by Verilog or another suitable hardware description language and then synthesized into digital circuits. Any combination of features of these example algorithms can be implemented by the temperature compensation circuit 260 of FIG. 2. Moreover, any of the principles and advantages of these example algorithms can be implemented at block 420 of the method 400.

While example algorithms are provided for illustrative purposes, it will be understood that a number of variants can be applied to the example algorithms in accordance with the principles and advantages described herein. As one example, an amount by which the temperature compensation value is incremented on each pass through a loop in one or more of the second to fourth example algorithms can be scaled by a fixed amount, which can adjust the segment length. As another example, a fixed scaled factor can be applied when initially computing the segment length, which can change positions of the break points TCOHI and TCOLO with respect to a frequency error over temperature curve of a crystal.

Algorithm 1: Piecewise Linear Linear Approximation

The first example algorithm is a piecewise linear approximation of a frequency error curve over temperature for a crystal. This algorithm is based on the observation that the temperature error curve for a number of crystals is approximately linear through a substantial portion of a typical operational temperature range. Accordingly, with a single linear fit to the frequency error over temperature curve, error near ambient temperature can be fairly well compensated.

In the first example algorithm, the low temperature breakpoint TCOLO and the high temperature breakpoint TCOHI can correspond to inflection points on a crystal frequency error versus temperature curve. At the low temperature breakpoint TCOLO and the high temperature breakpoint TCOHI, the slope of the piecewise linear temperature compensation approximation can be reversed. A temperature compensation value fc can be computed in accordance with Equations 2-4:

if($T < TCOLO$), $fc = SLOPE*(3*TCOLO - TCOHI - 2*T)$ (Equation 2)

if($TCOLO <= T <= TCOHI$), $fc = SLOPE*(2*T - TCOHI - TCOLO)$ (Equation 3)

if($T > TCOHI$), $fc = SLOPE*(3*TCOHI - TCOLO - 2*T)$ (Equation 4)

Equations 2-4 describe a piecewise linear temperature compensation approximation having one segment in each of three different regions. Equations 2-4 can be implemented in digital logic on the frequency synthesizer die. In one embodiment, the first example algorithm can compute the temperature compensation value in one clock cycle.

For temperatures below between the low temperature breakpoint TCOLO and the high temperature breakpoint TCOHI, the temperature compensation value fc can be computed based on Equation 3. According to Equation 3, the temperature compensation value can be computed by multiplying a quantity proportional to the indication of temperature T minus the center point between the temperature breakpoints by the slope multiplier SLOPE.

For temperatures below the low temperature breakpoint TCOLO, the temperature compensation value fc can be computed based on Equation 2. According to Equation 2, the temperature compensation value can be computed by multiplying a quantity proportional to the half the distance between the break points below the low temperature break point minus the indication of temperature T by the slope multiplier SLOPE.

For temperatures above the high temperature breakpoint TCOHI, the temperature compensation value fc can be computed based on Equation 4. According to Equation 4, the temperature compensation value can be computed by multiplying a quantity proportional to the half the distance between the break points above the high temperature break point minus the indication of temperature T by the slope multiplier SLOPE.

Figure 5:
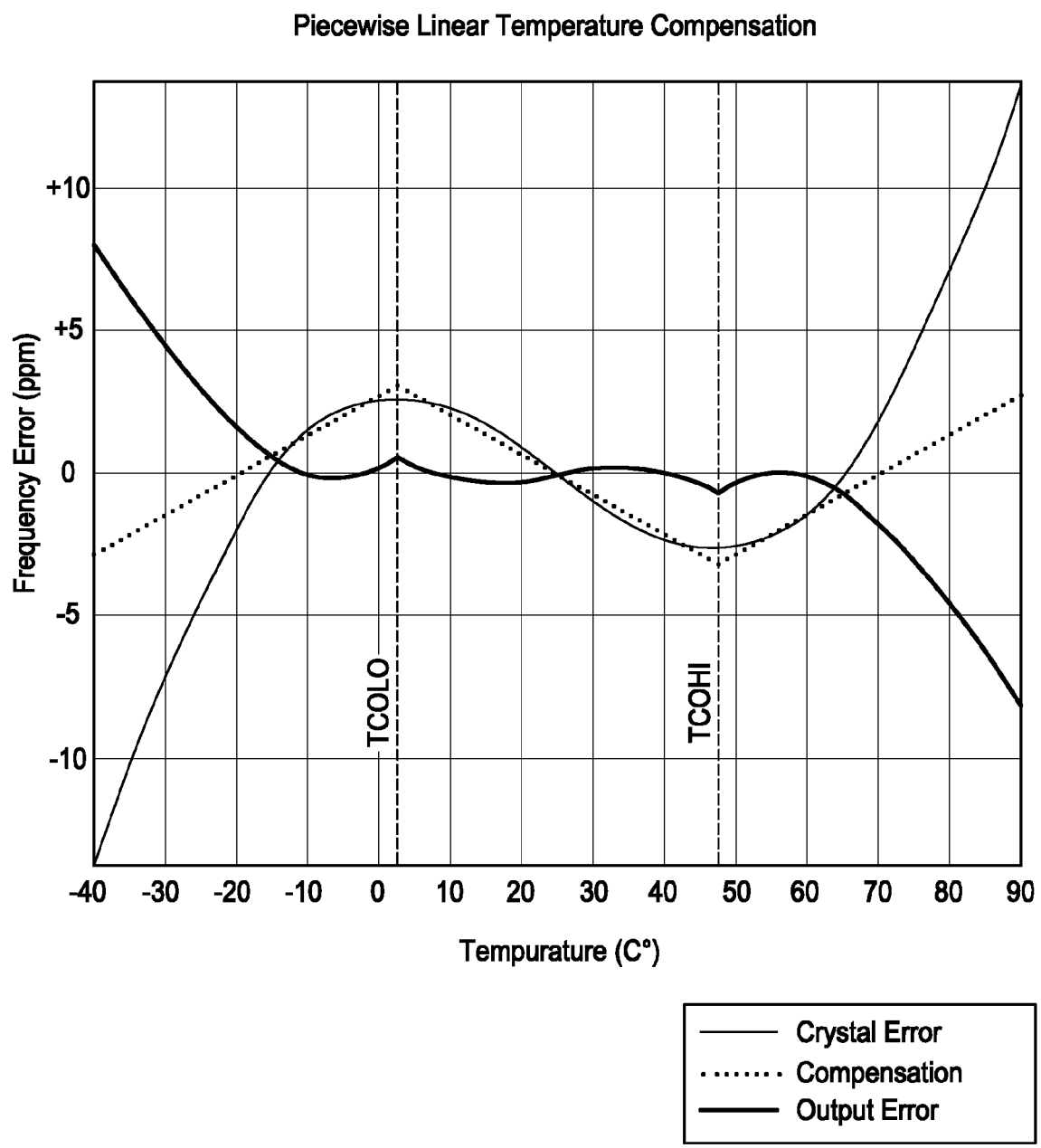
FIG. 5 is a plot related to a piecewise linear temperature compensation approximation, according to an embodiment.

FIG. 5 is a plot of frequency error over temperature that includes a crystal error curve with a cubic fit for a particular crystal, a compensation curve representing a piecewise linear linear temperature approximation, and an output error curve representing the frequency error of the output clock signal of a frequency synthesizer over temperature. This plot corresponds to one implementation of the frequency synthesizer 120 of FIG. 2 in which the temperature compensation circuit 260 implements temperature compensation based on Equations 2-4. As shown in FIG. 5, the piecewise linear linear temperature compensation approximation compensates for temperature-dependent frequency error fairly well in the temperature range between about −15° C. and 65° C. The output error in this temperature range can be no greater than about 1 ppm as shown by the output error curve in FIG. 5. Thus, the piecewise linear-linear algorithm can effectively reduce temperature-dependent frequency errors for temperatures a typical operating temperature range.

Algorithm 2: Piecewise Linear Quadratic Approximation

The second example algorithm is a piecewise linear quadratic approximation of a frequency error curve over temperature for a crystal. In the second example algorithm, an approximation to a quadratic curve is used. According to certain embodiments, the quadratic approximation can be more accurate than the linear approximation of the first algorithm for at least some temperature values. Because the frequency error over temperature plots for typical crystals are cubic and antisymmetric about a center point, the quadratic approximation can be inverted on one side of the center point to make the approximation antisymmetric. The difference between quadratic and cubic approximations can be negligible within a typical commercial temperature range, according to certain embodiments.

In the second example algorithm, the low temperature breakpoint TCOLO and the high temperature breakpoint TCOHI can correspond to break points that are at or near the inflection points on a crystal frequency error versus temperature curve. For instance, the temperatures corresponding to the inflection points can be multiplied by 4/3 in the example below. This multiplication can be done off chip in some implementations.

After obtaining an indication of temperature, the following example algorithm can be applied to compute a temperature compensation value from a piecewise linear quadratic approximation:

---
Center Point = (TCOHI + TCOLO) / 2
Segment Length = (TCOHI − TCOLO) / 4
Distance to Center Point = |T − Center Point|
fc = − Distance to Center Point
while (true), do:
    Distance to Center Point = Distance to Center Point − Segment Length
    if (Distance to Center Point < 0), break
    fc = fc + Distance to Center Point
endwhile
if (T < Center Point), fc = −fc
fc = SLOPE * fc

---

In this example algorithm, the center point can be computed by averaging the low temperature break point TCOLO and the high temperature break point TCOHI. A segment length can then be computed. The segment length can be selected based on a desired precision of the piecewise linear quadratic approximation. A smaller segment length can result in more linear segments in a piecewise linear temperature approximation. In the example above, the segment length is selected as being one fourth the difference between the low temperature break point TCOLO and the high temperature break point TCOHI. This can provide four different linear segments between the break points in the compensation curve. Other segment lengths can alternatively be used. The difference between the indication of temperature T and the center point can be computed. Then, the first approximation of the temperature compensation value can be set to the opposite of the difference to begin with a linear approximation. The algorithm can increment the temperature compensation value until the center point is reached. Then the sign of the temperature compensation value can be inverted when the indication of temperature is below the center point to make the piecewise linear quadratic approximation an odd function. The temperature compensation value can then be scaled by the slope multiplier SLOPE. In some embodiments, the second example algorithm can compute a temperature compensation value in about 8 to 10 clock cycles.

With a segment length of one third of the difference between the break points TCOHI and TCOLO, the break points can be at approximately the inflection points of the frequency error over temperature curve. Since a divide by three can be computationally expensive, the segment length can be selected to be one fourth of the difference between the break points TCOHI and TCOLO in one embodiment. In this embodiment, the positions of the breakpoints TCOHI and TCOLO can be derived by multiplying the inflection points of the frequency error over temperature curve for a crystal by 4/3 and providing the break points to the temperature compensation circuit. The multiplication by 4/3 can be done off chip. Dividing by four to compute the segment length can be implemented on die by a 2-bit shift.

Figure 6:
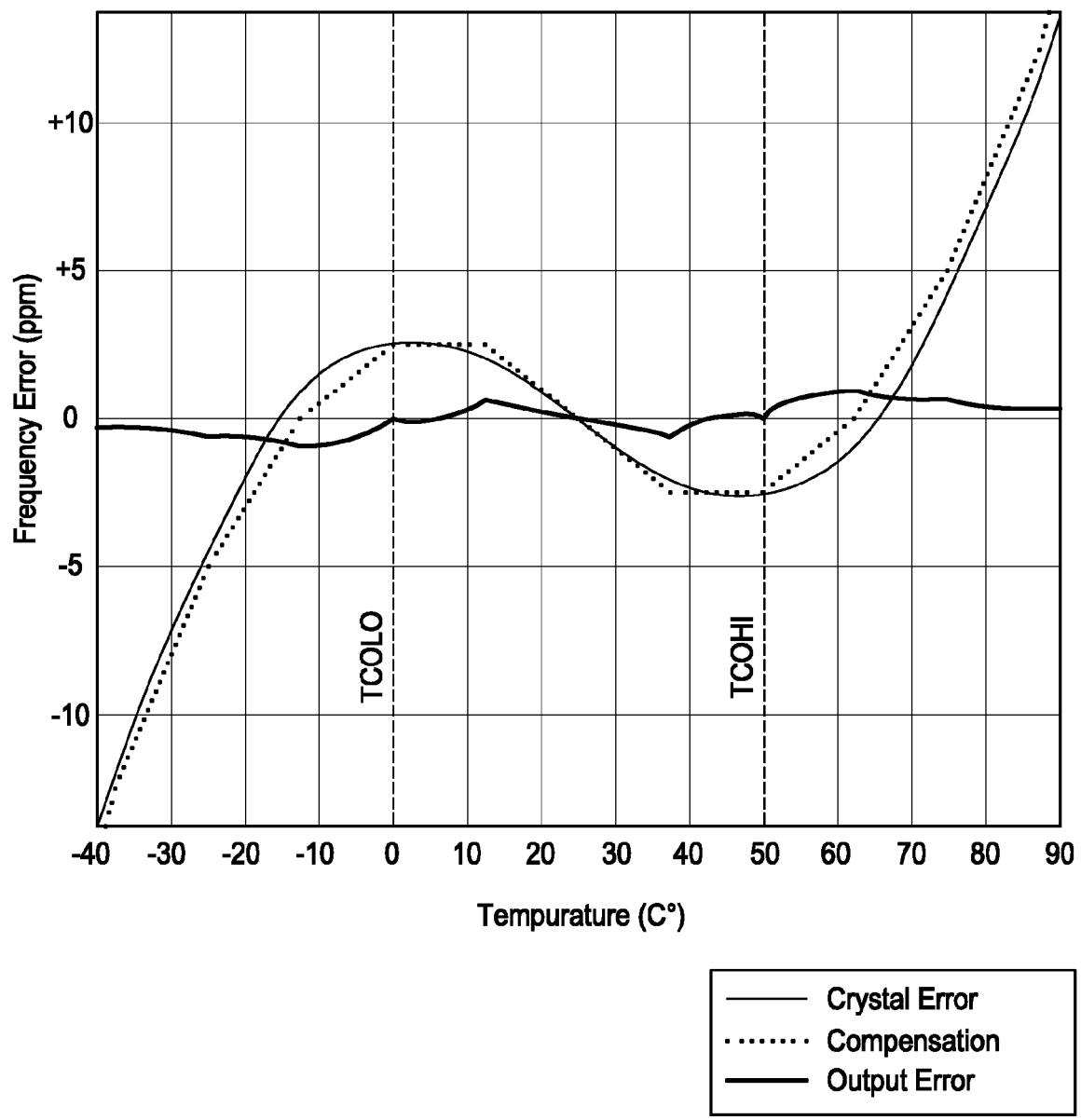
FIG. 6 is a plot related to a piecewise linear temperature compensation approximation with a quadratic profile, according to an embodiment.

FIG. 6 is a plot of frequency error over temperature that includes a crystal error curve with a cubic fit for a particular crystal, a compensation curve representing a piecewise linear quadratic temperature approximation, and an output error curve representing the frequency error of the output clock signal of a frequency synthesizer over temperature. This plot corresponds to one implementation of the frequency synthesizer 120 of FIG. 2 in which the temperature compensation circuit 260 implements temperature compensation based on second example algorithm.

As shown in FIG. 6, the piecewise linear quadratic temperature approximation is divided into segments. For example, there are four segments of the piecewise linear quadratic temperature approximation in the temperature region between the break points TCOLO and TCOHI. As illustrated in FIG. 6, the temperature correction applied by the second example algorithm can be zero at the center point between the break points TCOLO and TCOHI. In FIG. 6, the slope of the first segment on either side of the center point can have a slope of the opposite of the slope multiplier SLOPE, the second segment on either side of the center point can have a slope of zero, the third segment on either side of the center point can have a slope of two times the slope multiplier SLOPE, the fourth segments away from the center point can have a slope of three times the slope multiplier SLOPE, and so on.

Figure 7:
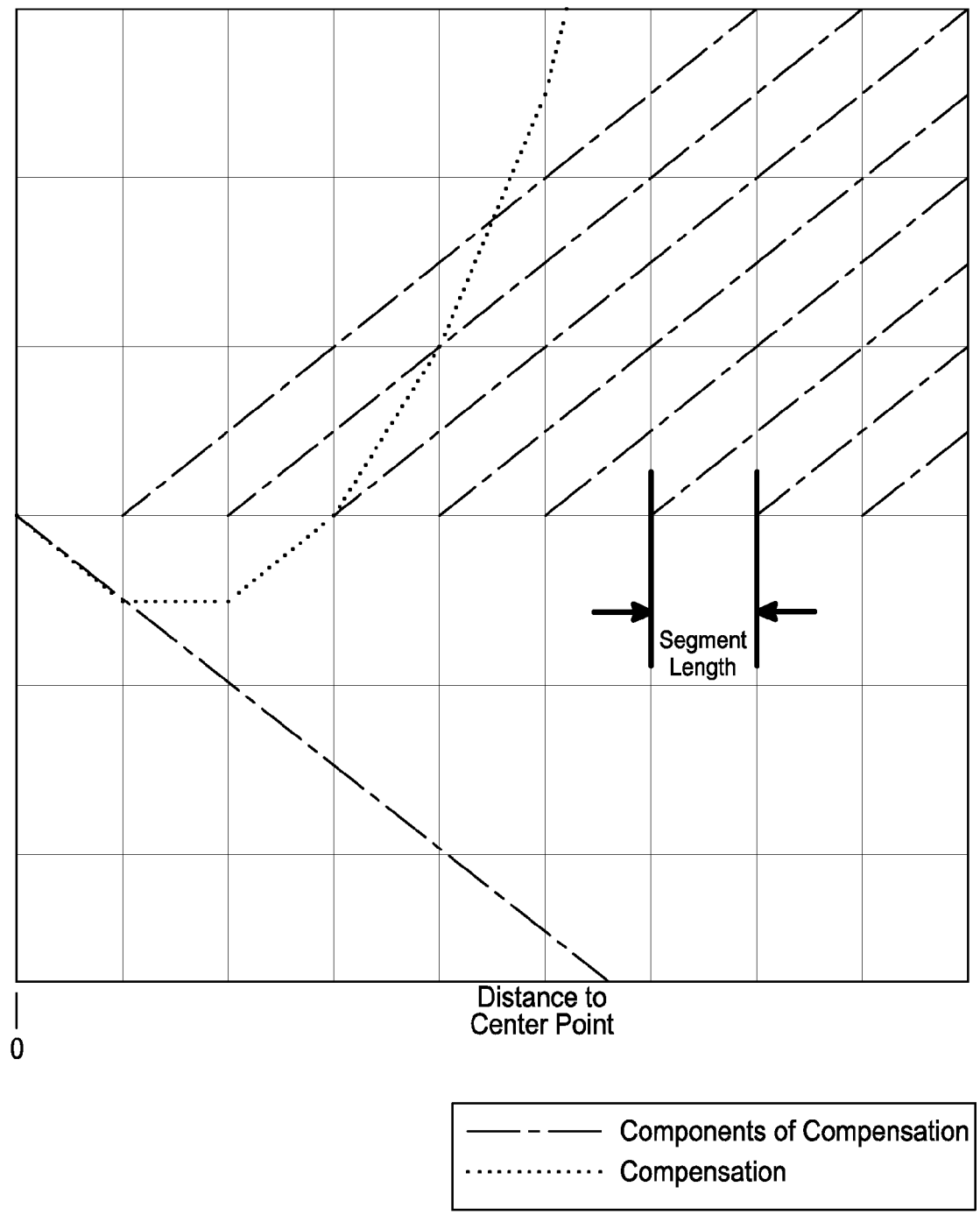
FIG. 7 illustrates how the compensation curve shown in FIG. 6 can be generated from a sum of components, according to an embodiment.

FIG. 7 shows how the second example algorithm can generate the slope of segments of a piecewise linear temperature compensation approximation as the sum of components. The first illustrated component can have a slope of the opposite of the slope multiplier SLOPE and the other illustrated components can have the slope of the slope multiplier SLOPE. In the second example algorithm, the slope for a particular segment of the piecewise linear temperature compensation can be computed based on the sum of components for the particular segment. Other quadratic algorithms can alternatively or additionally be implemented.

Referring back to FIG. 6, output error curve shows the piecewise linear quadratic temperature compensation approximation can compensate for temperature-dependent frequency error fairly well in the temperature range between about −40° C. and 90° C. Throughout this range, the output error in can be no greater than about 1 ppm as shown by the output error curve in FIG. 6. A piecewise linear quadratic algorithm can effectively reduce temperature-dependent frequency errors for temperatures over a wider operating temperature range than a piecewise linear linear algorithm, in some instances.

Algorithm 3: Piecewise Linear Cubic Approximation

The third example algorithm is a piecewise linear cubic approximation of a frequency error curve over temperature for a crystal. In the third example algorithm, an approximation to a quadratic curve is used. According to certain embodiments, the cubic approximation can be more accurate than the linear approximation of the first example algorithm and/or the quadratic approximation of the second example algorithm for at least some temperature values.

The third example algorithm is a variation of the second example algorithm in which the slope in the piecewise linear cubic approximation can increase more rapidly as temperature moves away from a center point than in a piecewise linear quadratic approximation. Accordingly, a cubic approximation can reduce temperature-dependent frequency errors better at extreme temperature compared to a quadratic approximation in certain implementations. As such, the cubic approximation can be well suited for applications with extreme operating temperatures, such as military and/or industrial applications.

After obtaining an indication of temperature, the following example algorithm can be applied to compute a temperature compensation value from a piecewise linear cubic approximation:

```
Center Point = (TCOHI + TCOLO) / 2
Segment Length = (TCOHI − TCOLO) / 4
Distance to Center Point = |T − Center Point|
fc = − Distance to Center Point
N = 1
while (true), do:
    Distance to Center Point = Distance to Center Point − Segment
    Length
    if (Distance to Center Point < 0), break
    fc = fc + (Distance to Center Point * N)
    N = N + 1
endwhile
if (T < Center Point), fc = -fc
fc = SLOPE * fc
```

The third example algorithm is similar to the second example algorithm. The third example algorithm keeps track of a loop count N, and multiplies distance to the center point by the loop count N in incrementing the temperature compensation value. This can increase slopes for segments away from the center point more rapidly than in the second example algorithm.

Algorithm 4: Piecewise Linear Cubic Approximation with Efficient Computation

The fourth example algorithm is a piecewise linear cubic approximation of a frequency error curve over temperature for a crystal. The fourth example algorithm is a variation of the third example algorithm. The fourth example algorithm can be more computationally efficient than the third example algorithm. In particular, the fourth example algorithm can replace multiplication of the third example algorithm with less computationally intensive operations, such as addition and bit shifting. Bit shifting can be a computationally inexpensive way of multiplying or dividing binary data by a power of 2 compared to binary multiplication.

After obtaining an indication of temperature, the following example algorithm can be applied to compute a temperature compensation value from a piecewise linear cubic approximation:

```
Center Point = (TCOHI + TCOLO) / 2
Segment Length = (TCOHI – TCOLO) / 4
Distance to Center Point = |T – Center Point|
fc = – Distance to Center Point
N = 1
D = 2
while (true), do:
    Distance to Center Point = Distance to Center Point – Segment
    Length
    if (Distance to Center Point < 0), break
    fc = fc + (Distance to Center Point * D / 4)
    N = N + 1
    if (N == 2), D = D *2
endwhile
if (T < Center Point), fc = –fc
fc = SLOPE * fc
```

In the fourth example algorithm, computational complexity can be reduced by multiplying by a value D that is the closest power of 2 to the value of the loop count N. The fourth example algorithm can track cubic curve at powers of 2. In some applications, the most error can be incurred at loop counts N in between powers of two, such as loop counts of 3 and 6. Since the fourth example algorithm is a piecewise linear approximation, the additional approximation by which the temperature compensation value is incremented at each segment by a loop count times the distance to the center point can be a relatively small additional error. Some embodiments can take advantage of the better accuracy of the fourth example algorithm by incrementing the temperature compensation value by half compared to the second example algorithm. This can make a segment boundary at inflection points of a frequency error over temperature curve have a non-zero slope, rather than a slope of zero as shown in FIG. 6. By setting the segment length to one fourth the difference between the breakpoints TCOHI and TCOLO, the values of the break points can correspond to inflections points of the frequency error over temperature curve in certain embodiments.

Figure 8:
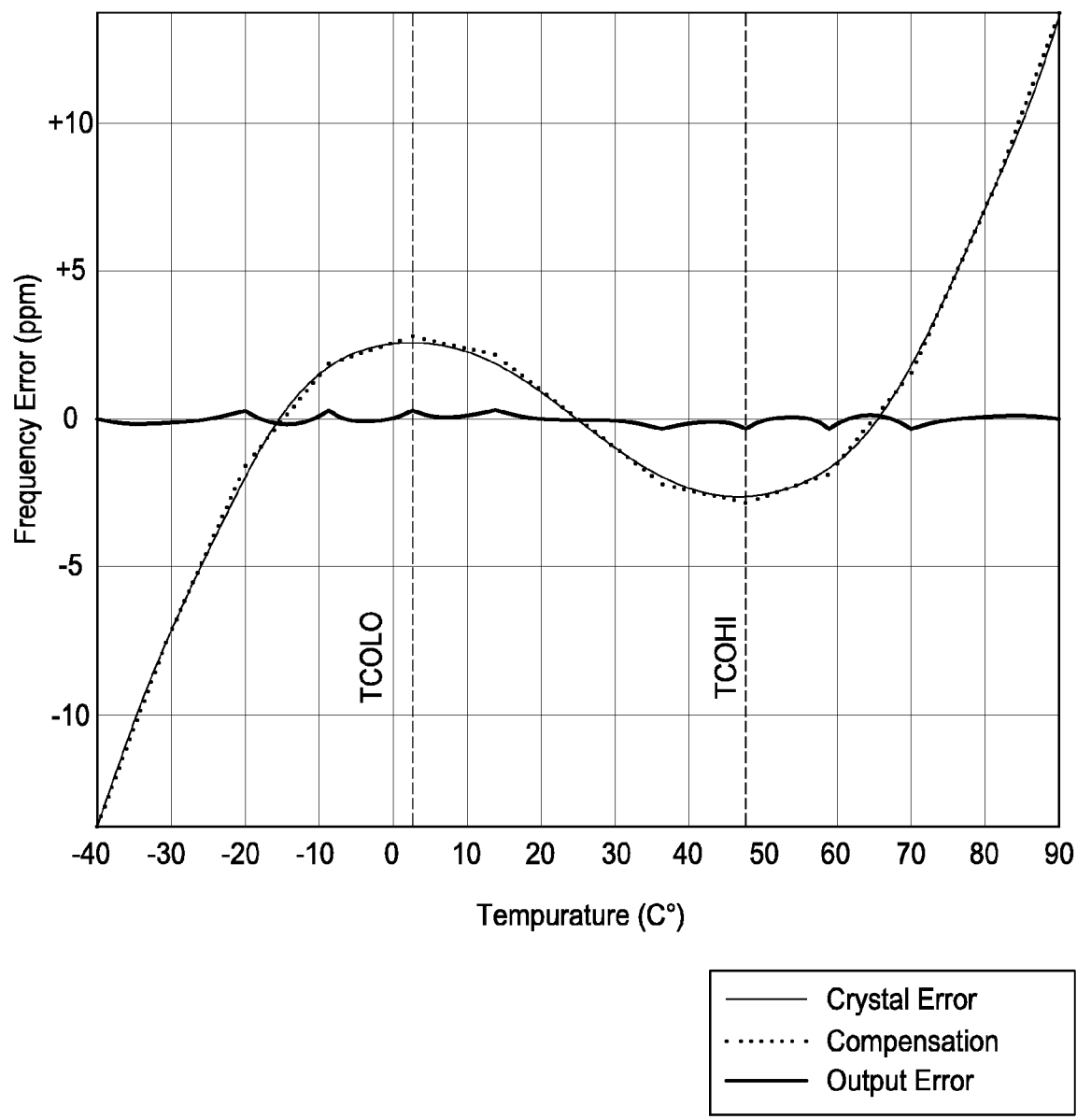
FIG. 8 is a plot related to a piecewise linear temperature compensation approximation with a cubic profile, according to an embodiment.

FIG. 8 is a plot of frequency error over temperature that includes the crystal error curve with a cubic fit for a particular crystal, a compensation curve representing a piecewise linear cubic temperature approximation, and an output error curve representing the frequency error of the output clock signal of a frequency synthesizer over temperature. This plot corresponds to one implementation of the frequency synthesizer 120 of FIG. 2 in which the temperature compensation circuit 260 implements the fourth example algorithm. As shown in FIG. 7, the piecewise linear cubic temperature compensation approximation can compensate for temperature-dependent frequency error quite well over the temperature range shown in FIG. 7. The output frequency error in a temperature range from about −40° C. and 90° C. can be no greater than about 0.5 ppm as shown by the output error curve in FIG. 7. Thus, the piecewise linear cubic algorithm can effectively reduce temperature-dependent frequency errors for temperatures in a wide temperature range.

Figure 9:
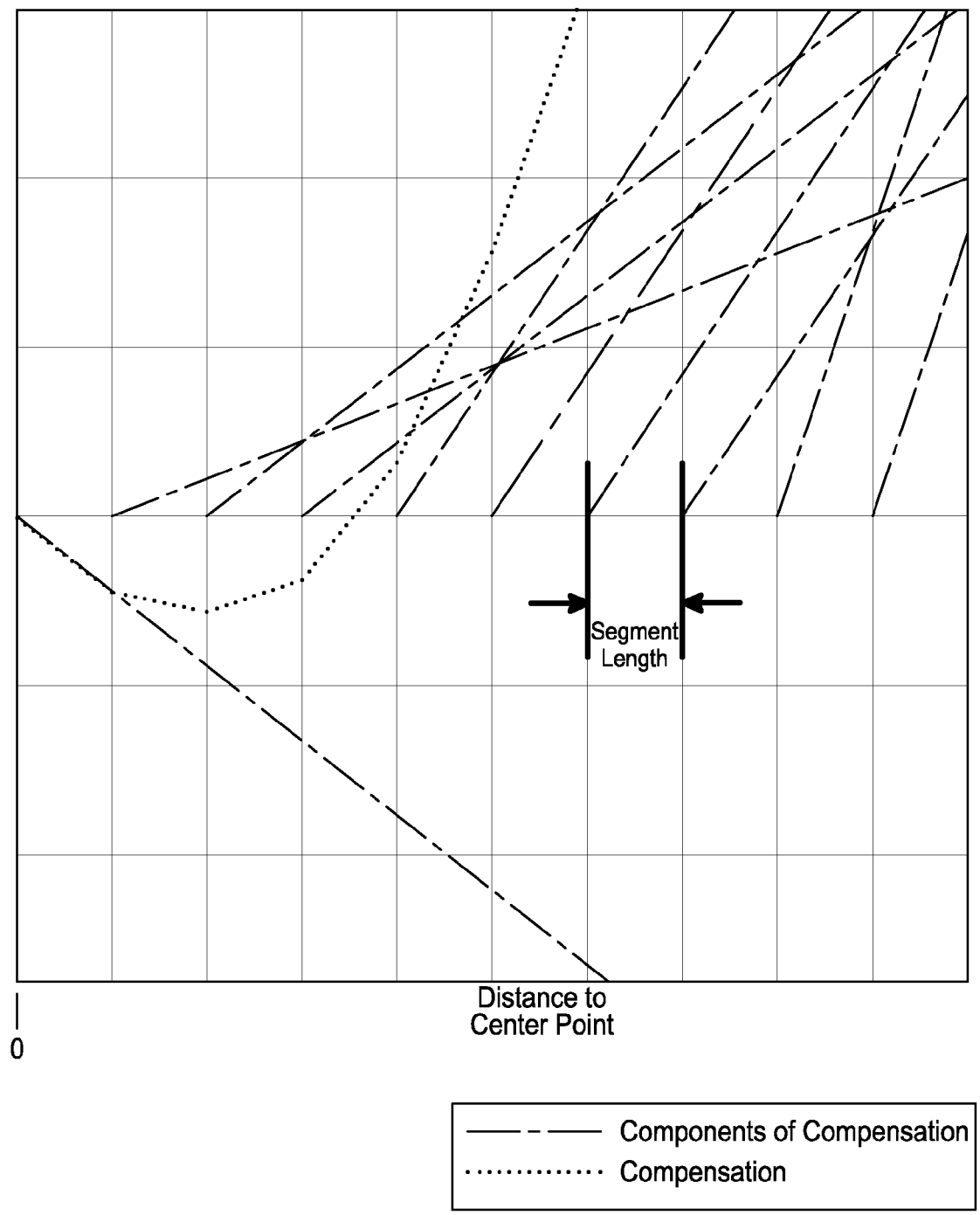
FIG. 9 illustrates how the compensation curve shown in FIG. 8 can be generated as a sum of components, according to an embodiment.

FIG. 9 shows how the fourth example algorithm can generate the slope of segments of the piecewise linear temperature compensation approximation as the sum of components. The first illustrated component can have a slope of the opposite of the slope multiplier SLOPE and the other illustrated components can have increasing positive slopes. The second illustrated component has a slope of ½ times the slope multiplier SLOPE, the next two illustrated components have slopes of the slope multiplier SLOPE, and the next four illustrated components have slopes of two times the slope multiplier SLOPE. In the fourth example algorithm, the slope for a particular segment of the piecewise linear temperature compensation can be computed based on the sum of components for the particular segment. Other cubic algorithms can alternatively or additionally be implemented.

Applications

In the embodiments described above, apparatus, systems, and methods for reducing temperature-dependent frequency error are described in connection with particular embodiments. It will be understood, however, that the principles and advantages of the embodiments can be used for any other systems, apparatus, or methods with a need for compensating for an offset in frequency that depends on a particular variable. For instance, instead of compensating for temperature-dependent frequency errors, frequency errors that depend on another parameter can be reduced. In such applications, the temperature compensation circuit and temperature compensation value can be replaced with a functionally similar compensation circuit and a compensation value, respectively, to compensate for frequency errors that depend on a different parameter. Moreover, although certain embodiments are described with reference to reducing temperature-dependent frequency errors caused by a signal generated by a crystal oscillator, it will be understood that the principles and advantages described herein can be applied to correcting for temperature-dependent frequency errors that result from other sources. In such applications, the stored data values can be selected and suitable values can be obtained such that a piecewise linear temperature compensation approximation can adequately compensate for errors for another source.

The methods, systems, and/or apparatus described herein can be implemented into various electronic devices. Examples of the electronic devices can include, but are not limited to, consumer electronic products, parts of the consumer electronic products, electronic test equipment, etc. Examples of parts of consumer electronic products can include analog-to-digital converts, amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

CONCLUSION

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An electronically-implemented method of compensating for a temperature offset in a crystal reference signal, the method comprising:
    obtaining an indication of a temperature;
    computing a temperature compensation value based on the indication of temperature and three values of a piecewise linear temperature compensation approximation, the piecewise linear temperature compensation approximation representing an approximation of frequency error of a crystal reference signal originating from a crystal over temperature as at least three linear segments, wherein said computing comprises using an algorithm for computing temperature compensation values on each of the three linear segments based on the same three values; and
    compensating for a temperature offset in the crystal reference signal by adjusting a division ratio of a fractional divider in a phase-locked loop based on the temperature compensation value, the phase-locked loop configured to lock a phase of a frequency divided version of an output signal of the phase-locked loop to the crystal reference signal.

2. The method of claim 1, wherein a temperature compensation circuit is configured to compute the temperature compensation value based on the piecewise linear temperature compensation approximation, and wherein the temperature compensation circuit is included on the same die as the phase-locked loop.

3. The method of claim 1, wherein obtaining comprises obtaining the indication of temperature via a temperature sensor on a die that includes the phase-locked loop.

4. The method of claim 1, wherein computing the temperature compensation value comprises accessing three values from electronic storage, and using the three values to compute the temperature compensation value.

5. An electronically-implemented method of compensating for a temperature offset in a crystal reference signal, the method comprising:
    obtaining an indication of temperature;
    computing a temperature compensation value based on the indication of temperature and a piecewise linear temperature compensation approximation, the piecewise linear temperature compensation approximation representing an approximation of frequency error of a crystal reference signal originating from a crystal over temperature as a plurality of linear segments, said computing comprising accessing three values from electronic storage and using the three values to compute the temperature compensation value, wherein the three values are indicative of a low temperature break point, a high temperature break point, and a slope multiplier; and
    compensating for a temperature offset in the crystal reference signal by adjusting a division ratio of a fractional divider in a phase-locked loop based on the temperature compensation value, the phase-locked loop configured to lock a phase of a frequency divided version of an output signal of the phase-locked loop to the crystal reference signal.

6. The method of claim 5, wherein the piecewise linear temperature compensation approximation is a quadratic approximation.

7. The method of claim 5, wherein the piecewise linear temperature compensation approximation is a cubic approximation.

8. An apparatus comprising:
    a phase-locked loop configured to receive a reference signal and to lock a phase of an output clock signal with a phase of the reference signal, the phase-locked loop comprising a fractional divider; and
    a temperature compensation circuit configured to:
        access three values of a piecewise linear temperature approximation from electronic storage, wherein the three values are indicative of a low temperature break point, a high temperature break point, and a slope multiplier; and
        compute a temperature compensation value based on an indication of temperature and the three values of the piecewise linear temperature compensation approximation, the piecewise linear temperature compensation approximation representing an approximation of frequency error in the reference signal over temperature,
    wherein the temperature compensation circuit is configured to compensate for a temperature offset in the frequency of the reference signal by adjusting the division ratio of the fractional divider based at least partly on the temperature compensation value.

9. The apparatus of claim 8, wherein a single die includes the temperature compensation circuit and the phase-locked loop.

10. The apparatus of claim 8, wherein the reference signal is generated by a crystal.

11. The apparatus of claim 8, further comprising a temperature sensor configured to generate the indication of temperature.

12. The apparatus of claim 11, further comprising an analog-to-digital converter configured to generate a digital output based on the indication of temperature, and to provide the digital output to the temperature compensation circuit.

13. The apparatus of claim 8, further comprising a summing circuit configured to sum a nominal fractional divider value and the temperature compensation value, and to provide the sum to the fractional divider of the phase-locked loop.

14. The apparatus of claim 8, wherein the piecewise linear temperature compensation approximation comprises one of a quadratic approximation or a cubic approximation of frequency error in the reference signal over temperature.

15. An apparatus comprising a die, the die comprising:
a phase-locked loop configured to receive a reference signal and to lock a phase of an output signal with a phase of the reference signal, the phase-locked loop comprising a fractional divider configured to divide the frequency of the output signal by a division ratio; and
a temperature compensation circuit configured to compute a temperature compensation value based on three stored values of a piecewise linear temperature compensation approximation and an indication of temperature, wherein the piecewise linear temperature compensation approximation represents at least three linear segments and the temperature compensation circuit is configured to compute the temperate compensation value using the same three stored values when the temperature compensation value is on any one of the three linear segments, wherein the temperature compensation circuit is configured to compensate for a temperature-dependent offset in the frequency of the reference signal by adjusting the division ratio of the fractional divider based at least partly on the temperature compensation value.

16. The apparatus of claim 15, wherein the temperature compensation circuit comprises digital circuit elements configured to implement the piecewise linear temperature compensation approximation.

17. The apparatus of claim 15, further comprising:
a crystal configured to generate the reference signal, wherein the crystal is separate from the die; and
a package enclosing the die and the crystal.

18. The apparatus of claim 17, further comprising a temperature sensor on the die, wherein the temperature sensor is configured to generate the indication of temperature.

19. The apparatus of claim 15, wherein the die comprises a fractional-N frequency synthesizer that includes the phase-locked loop.

20. The apparatus of claim 15, wherein the temperature compensation approximation is divided into three regions including a low temperature region for temperatures below a low temperature breakpoint, a middle temperature region for temperatures between the low temperature breakpoint and a high temperature breakpoint, and a high temperature region for temperatures above the high temperature breakpoint, and wherein the three segments each correspond to a different region of the three regions.

21. The apparatus of claim 15, wherein the temperature compensation approximation is divided into three regions including a low temperature region for temperatures below a low temperature breakpoint, a middle temperature region for temperatures between the low temperature breakpoint and a high temperature breakpoint, and a high temperature region for temperatures above the high temperature breakpoint, and wherein the three segments represent at least a portion of only one of the three regions.

22. The apparatus of claim 15, wherein the die further comprises electronic storage configured to store the three stored values.

* * * * *